United States Patent
Ichiyama et al.

(10) Patent No.: US 7,412,341 B2
(45) Date of Patent: Aug. 12, 2008

(54) JITTER AMPLIFIER, JITTER AMPLIFICATION METHOD, ELECTRONIC DEVICE, TESTING APPARATUS, AND TESTING METHOD

(75) Inventors: Kiyotaka Ichiyama, Tokyo (JP); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/390,340

(22) Filed: Mar. 28, 2006

(65) Prior Publication Data

US 2007/0239388 A1 Oct. 11, 2007

(51) Int. Cl.
*G06F 19/00* (2006.01)

(52) U.S. Cl. .................. 702/107; 702/106; 375/224; 375/226; 324/613; 324/614

(58) Field of Classification Search .................. 702/107, 702/106; 348/725, 726, 731; 342/46, 93; 375/224–227; 324/600, 613, 614, 616, 622
See application file for complete search history.

(56) References Cited

U.S. PATENT DOCUMENTS 6,377,315 B1 * 4/2002 Carr et al. .................... 348/726
2002/0140869 A1 * 10/2002 Carr et al. .................... 348/726

FOREIGN PATENT DOCUMENTS

| JP | 59-9484 | 3/1959 |
| JP | 4-69863 | 3/1992 |
| JP | 2001-290555 | 10/2001 |
| JP | 2006-25131 | 1/2006 |

* cited by examiner

*Primary Examiner*—John E Barlow, Jr.
*Assistant Examiner*—Hien X Vo
(74) *Attorney, Agent, or Firm*—Sterne, Kessler, Goldstein & Fox P.L.L.C.

(57) ABSTRACT

There is provided a jitter amplifier for amplifying or attenuating a jitter component contained in an input signal, having a jitter demodulating section for demodulating the jitter component from the input signal and an amplifying circuit for amplifying or attenuating the jitter component by controlling phase of the input signal based on the jitter component.

22 Claims, 15 Drawing Sheets

JITTER AMPLIFIER, JITTER AMPLIFICATION METHOD, ELECTRONIC DEVICE, TESTING APPARATUS, AND TESTING METHOD

BACKGROUND OF THE INVENTION

1. Field of the Invention

The present invention relates to a jitter amplifier, a jitter amplification method, an electronic device, a test apparatus and a testing method. More specifically, the invention relates to a jitter amplifier for amplifying or attenuating a jitter component contained in an input signal and to an electronic device and a test apparatus having such jitter amplifier

2. Related Art

Conventionally, there has been known a PLL (Phase Locked Loop) as a circuit for outputting a jitter component contained in an input signal by changing it by a predetermined gain G. However, an original purpose of use of the PLL is to generate an oscillating signal synchronized with a reference signal and is not to change and output the jitter component The PLL has a phase detector, a loop filter, a voltage controlled oscillator and a frequency divider. The phase detector compares phase of a predetermined reference signal (input signal) with that of an oscillating signal and outputs a control signal corresponding to their phase difference.

The loop filter passes a predetermined frequency component of the control signal. The voltage controlled oscillator generates the oscillating signal having frequency corresponding to voltage level of the control signal passed by the loop filter. This oscillating signal is fed back to the phase detector via the frequency divider. Having such arrangement, the PLL generates the oscillating signal synchronized with the reference signal.

Here, a transfer function of the phase detector will be denoted as Kd, a transfer function of the loop filter as F(s) and a transfer function of the voltage controlled oscillator as $K_0/s$ and a frequency dividing ratio of the frequency divider is assumed to be 1. In this case, an open-loop transfer function $H_{OPEN}(s)$ of the PLL may be expressed by Equation 1 as follows:

$$H_{OPEN}(s) = \frac{Kd \cdot F(s) \cdot K_0}{s} \qquad \text{Eq. 1}$$

Further, a closed-loop transfer function $H_{CLOSED}(s)$ may be expressed by using the open-loop transfer function by Equation 2 as follows:

$$H_{CLOSED}(s) = \frac{H_{OPEN}(s)}{1 + H_{OPEN}(s)} \qquad \text{Eq. 2}$$

From the above, a gain $G(\omega)$ of the PLL may be expressed by Equation 3 in a control zone as follows:

$$G(\omega) = \pm|H_{CLOSED}(j\omega)| = \pm\left|\frac{H_{OPEN}(j\omega)}{1 + H_{OPEN}(j\omega)}\right| \qquad \text{Eq. 3}$$

Here, $\omega$ is angular frequency.

Accordingly, the gain $G(\omega)$ of the PLL is in a range of 1 or less and $-1$ or more.

The PLL is designed so that the gain $G(\omega)$ is almost zeroed in general in order to reduce jitter in the oscillating signal. However, the gain $G(\omega)$ must be almost 1 in a low offset frequency range in order to synchronize the phase of the oscillating signal with the reference signal. Therefore, it is unable to attenuate the jitter in the low offset frequency even if the PLL is used as a jitter attenuator.

Still more, because the gain $G(\omega)$ of the PLL is in the range of 1 or less and $-1$ or more as described above, it is unable to amplify the jitter component of the reference signal. That is, the PLL is incapable of functioning as a jitter amplifier.

SUMMARY OF THE INVENTION

Accordingly, it is an object of the invention to provide a jitter amplifier, a jitter amplification method, an electronic device, a test apparatus and a testing method, which are capable of solving the above-mentioned problem. This object may be achieved through the combination of features described in independent claims of the invention. Dependent claims thereof specify preferable embodiments of the invention.

That is, according to a first aspect of the invention, there is provided a jitter amplifier for amplifying or attenuating a jitter component contained in an input signal, having a jitter demodulator for demodulating the jitter component from the input signal and an amplifying circuit for amplifying or attenuating the jitter component by controlling phase of the input signal based on the jitter component.

The amplifying circuit may have a variable delay circuit that outputs the input signal by delaying by a value of delay based on the jitter component.

The jitter demodulator way output voltage corresponding to the jitter component and the variable delay circuit may delay the input signal by a value of delay corresponding to a value of voltage outputted out of the jitter demodulator.

The jitter demodulator may also output current corresponding to the jitter component and the variable delay circuit may delay the input signal by a value of delay corresponding to a value of current outputted out of the jitter demodulator.

The jitter demodulator may demodulate period jitter of the input signal.

The jitter demodulator may have a pulse generator for outputting a pulse signal having a preset pulse width corresponding to edges of the input signal and a low-pass filter for demodulating the period jitter by removing a carrier frequency component of the input signal from the pulse signal.

The jitter demodulator may also demodulate timing jitter of the input signal.

The jitter demodulator may have a pulse generator for outputting a pulse signal having a preset pulse width corresponding to edges of the input signal, a low-pass filter for demodulating the period jitter by removing a carrier frequency component of the input signal from the pulse signal and an integrator for demodulating the timing jitter of the input signal by integrating the period jitter outputted out of the low-pass filter.

The jitter demodulator may have a pulse generator for outputting a pulse signal having a preset pulse width corresponding to edges of the input signal, an integrator for demodulating the timing jitter of the input signal by integrating the pulse signals and a sample and hold circuit for sampling the timing jitter at edge timing of the input signal.

The input signal may be a data signal and the jitter demodulator may demodulate jitter of the data signal.

The jitter demodulator may have a complementary data generator for generating a complementary data signal whose data value transits at bit boundaries where a data value of the data signal does not transits, an exclusive OR circuit for outputting an exclusive OR of the data signal and the complementary data signal and a demodulating circuit for demodulating jitter of a signal outputted out of the exclusive OR circuit.

The jitter amplifier may further include a gain control section for controlling an amplification factor of the jitter component outputted out of the jitter demodulator with respect to the jitter component contained in the input signal.

The gain control section may control the amplification factor in the jitter demodulator so that the jitter component is canceled in the variable delay circuit.

The value of delay in the variable delay circuit may vary almost linearly with respect to the voltage value or current value outputted out of the jitter demodulator.

The jitter amplifier may have first and second jitter demodulators and first and second amplifying circuits, wherein the first jitter demodulator may demodulate the jitter component from the input signal, the first amplifying circuit may amplify or attenuate the jitter component in the input signal by controlling phase of the input signal based on the jitter component demodulated by the first jitter demodulator, the second jitter demodulator may demodulate the jitter component contained in a signal outputted out of the first amplifying circuit and the second amplifying circuit may amplify or attenuate the jitter component in the signal by controlling phase of the signal outputted out of the first amplifying circuit based the jitter component demodulated by the second jitter demodulator.

According to a second aspect of the invention, there is provided a jitter amplification method for amplifying a jitter component contained in an input signal, having a jitter demodulating step of demodulating the jitter component from the input signal and an amplifying step of amplifying or attenuating the jitter component by controlling phase of the input signal based on the demodulated jitter component.

According to a third aspect of the invention, there is provided an electronic device that outputs an output signal, having an operating circuit for generating the output signal and a jitter amplifier for amplifying or attenuating and outputting a jitter component contained in the output signal, and the jitter amplifier has a jitter demodulator for demodulating the jitter component from the output signal and an amplifying circuit for amplifying or attenuating the jitter component by controlling phase of the output signal based on the demodulated jitter component.

According to a fourth aspect of the invention, there is provided an electronic device to which an input signal is inputted, having a jitter amplifier for amplifying or attenuating and outputting a jitter component contained in the input signal and an operating circuit that operates based on a signal outputted out of the jitter amplifier, and the jitter amplifier has a jitter demodulator for demodulating the jitter component from the input signal and an amplifying circuit for amplifying or attenuating the jitter component by controlling phase of the input signal based on the demodulated jitter component.

According to a fifth aspect of the invention, there is provided a test apparatus for testing an electronic device, having a pattern generating section for generating a test signal to be inputted to the electronic device, a jitter injecting section for injecting a jitter component into the test signal, a jitter amplifier for amplifying or attenuating the jitter component injected into the test signal and a driver for inputting the signal outputted out of the jitter amplifier to the electronic device, and the jitter amplifier has a jitter demodulator for demodulating the jitter component from the test signal and an amplifier circuit for amplifying the jitter component by controlling phase of the test signal based on the jitter component.

According to a sixth aspect of the invention, there is provided a test apparatus for testing an electronic device, having a jitter amplifier for amplifying or attenuating a jitter component of an output signal of the electronic device, a comparator for measuring the output signal outputted out of the jitter amplifier and a judging section for judging whether or not the electronic device is defect-free based on a result measured by the comparator, and the jitter amplifier has a jitter demodulator for demodulating the jitter component from the test signal and an amplifier circuit for amplifying the jitter component by controlling phase of the test signal based on the jitter component.

According to a seventh aspect of the invention, there is provided a testing method for testing an electronic device, having a pattern generating step of generating a test signal to be inputted to the electronic device, a jitter injecting step of injecting a jitter component into the test signal, a jitter amplifying step of amplifying or attenuating the jitter component injected to the test signal, and a driving step of inputting the signal outputted in the amplifying step to the electronic device, and the jitter amplifying step includes a jitter demodulating step of demodulating the jitter component from the test signal and an amplifying step of amplifying the jitter component by controlling phase of the test signal based on the jitter component.

According to an eighth aspect of the invention, there is provided a testing method for testing an electronic device, having a jitter amplifying step of amplifying or attenuating a jitter component of an output signal of the electronic device, a comparing step of measuring the output signal outputted in the jitter amplifying step and a judging step of judging whether or not the electronic device is defect-free based on a result measured in the comparing step, and the jitter amplifying step includes a jitter demodulating step of demodulating the jitter component from the test signal and an amplifying step of amplifying or attenuating the jitter component by controlling phase of the test signal based on the jitter component.

It is noted hat the summary of the invention described above does not necessarily describe all necessary features of the invention. The invention may also be a subcombination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
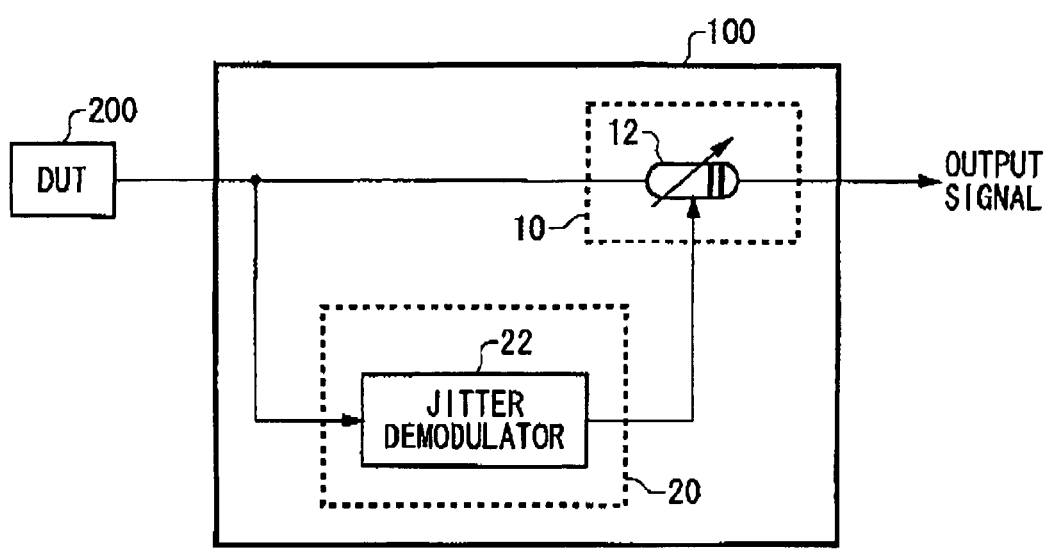
FIG. 1 is a diagram showing one exemplary configuration of a jitter amplifier 100 according to an embodiment of the invention.

FIG. 1 is a diagram showing one exemplary configuration of a jitter amplifier 100 according to an embodiment of the invention. The jitter amplifier 100 is a circuit for amplifying or attenuating a jitter component contained in a given input signal. In the present embodiment, the jitter amplifier 100 receives a signal outputted out of an electronic device 200 such as a semiconductor circuit as the input signal. The jitter amplifier 100 has a sampling section 20 and an amplifying circuit 10.

The sampling section 20 has a jitter amplifier 22 and samples the jitter component contained in the input signal. For example, the input signal is branched and fed to the sampling section 20 for example. The jitter amplifier 22 demodulates the jitter component from the input signal. The jitter amplifier 22 may demodulate timing jitter or period jitter of the input signal for example. A configuration and operation of the jitter amplifier 22 will be described later in connection with FIGS. 3 through 10.

The amplifying circuit 10 amplifies or attenuates the jitter component in the input signal by controlling phase of the input signal based on the jitter component sampled by the sampling section 20. For example, the input signal is given to the amplifying circuit 10 in parallel with the sampling section 20. The amplifying circuit 10 may have a variable delay circuit 12 for amplifying or attenuating the jitter component in the input signal by delaying the input signal by a value of delay based on the jitter component.

The jitter amplifier 22 controls the value of delay in the variable delay circuit 12 corresponding to the jitter component. The variable delay circuit 12 is a circuit for generating the value of delay corresponding to level of a given control signal for example and the jitter amplifier 22 generates the control signal on the level corresponding to a degree of jitter of the demodulated jitter component.

The jitter amplifier 22 may output voltage corresponding to the jitter component as the control signal. In this case, the variable delay circuit 12 delays the input signal with a value of delay corresponding to the value of voltage of the control signal. The jitter amplifier 22 may also output current corresponding to the jitter component as the control signal. In this case, the variable delay circuit 12 delays the input signal with a value of delay corresponding to the value of current of the control signal.

It is preferable for the value of delay in the variable delay circuit 12 to vary almost linearly with respect to the values of voltage or current outputted out of the jitter amplifier 22.

Figure 2:
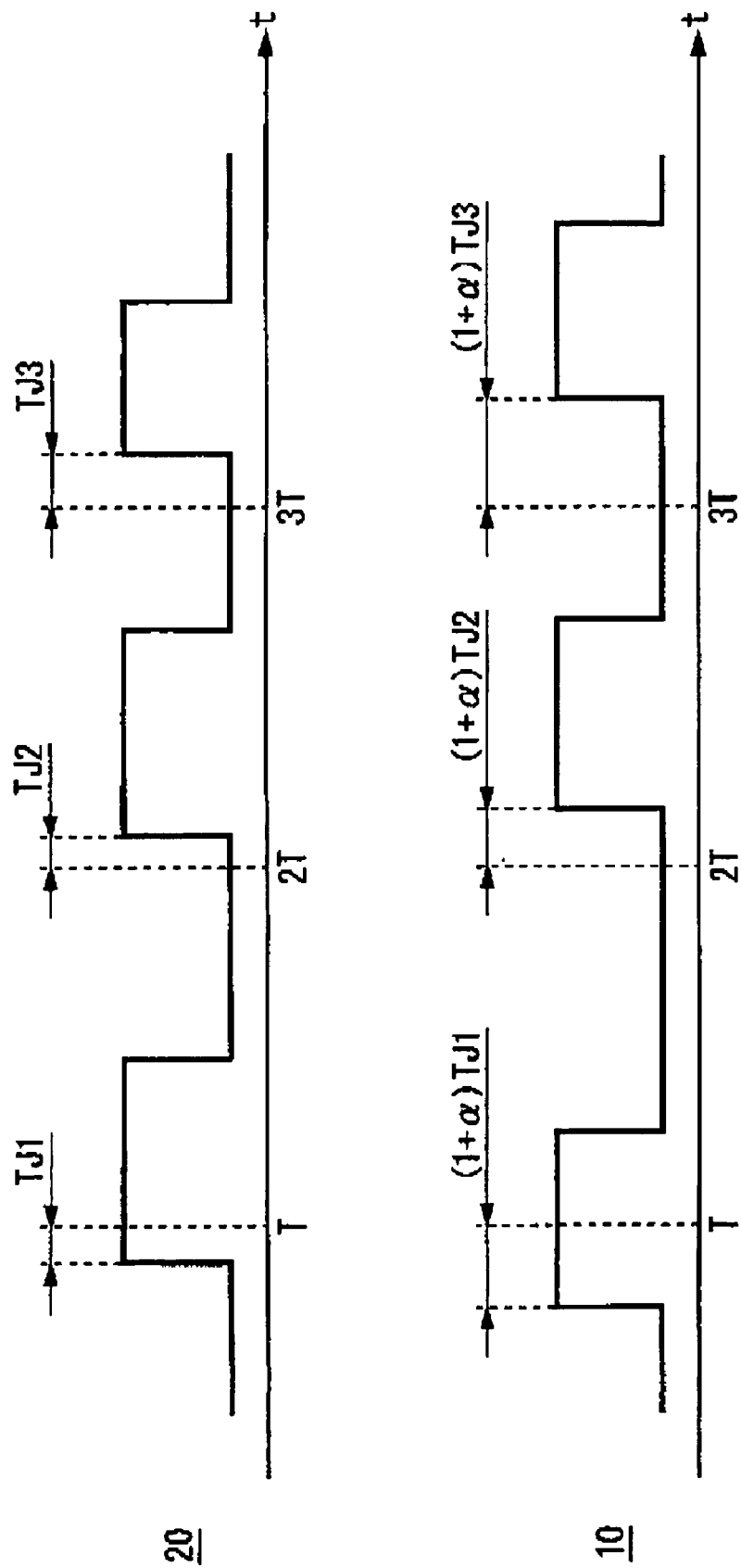
FIG. 2 is a chart showing exemplary waveforms of an input signal inputted to a sampling section 20 and of an output signal outputted out of an amplifying circuit 10.

FIG. 2 is a chart showing exemplary waveforms of the input signal inputted to the sampling section 20 and of the output signal outputted out of the amplifying circuit 10. In FIG. 2, times T, 2T 3T, . . . denote ideal timing where he input signal should have edges. That is, T denotes a period of the input signal.

Phase of each edge of the input signal deviates from the ideal timing due to the jitter component contained in the input signal. For example, a first edge (edge corresponding to time T) of the input signal deviates from the ideal timing by TJ1 and a second edge (edge corresponding to time 2T) deviates from the ideal timing by TJ2. The sampling section 20 detects the phase shift of each edge from the ideal timing. The sampling section 20 may detect the phase shift in each period of the input signal.

Still more, although the sampling section 20 detects the phase shift of the rising edge of each pulse of the input signal in the present example, the sampling section 20 may detect a phase shift of the falling edge of each pulse and may detect a phase shift of rising and falling edges in other examples. Still more, the sampling section 20 may detect a periodic shift of each period from the ideal period T of the input signal per each period.

Based on the jitter component detected in each period of the input signal, the sampling section 20 controls the value of delay in the variable delay circuit 12. Here, the variable delay circuit 12 may set a different value of delay in each period of the input signal. The sampling section 20 may control the value of delay of the variable delay circuit 12 in the corresponding period of the input signal in response to a degree of jitter detected in each period of the input signal.

When the phase of the edge delays from the ideal timing 2T, like the second edge in the figure, in amplifying the jitter component for example, the variable delay circuit 12 increases a value of delay of the edge corresponding to the value of jitter TJ2 to delay the phase of the edge farther to amplify the value of jitter TJ2.

Still more, when the phase of an edge is advancing from the ideal timing T, like the first edge, in amplifying the jitter component, the variable delay circuit 12 reduces a value of delay of the edge corresponding to the value of jitter TJ1 to advance the phase of the edge further to amplify the value of jitter TJ1.

It is also preferable to set a predetermined value of delay in the variable delay circuit 12 as an initial value of delay. That is, the variable delay circuit 12 delays a jitter-free edge based on the initial value of delay. It allows the phase of the edge to be advanced further by reducing the value of delay even when the phase of the edge is advancing with the ideal timing.

An amplification factor of the jitter component in the variable delay circuit 12 may be expressed as $1+\alpha$ as shown in FIG. 2. Here, $\alpha$ is determined by a gain in the jitter amplifier 22 and the variable delay circuit 12. That is, when a gain on the level of the control signal outputted out of the jitter amplifier 22 to a degree of jitter of the jitter component inputted to the jitter amplifier 22 is $K_{JD}$ and a gain of a value of delay in the variable delay circuit 12 to the level of the control signal is $K_{VD}$, $\alpha = K_{JD} \times K_{VD}$.

If $\alpha$ is plus, the jitter component in the input signal is amplified and if $\alpha$ is minus, the jitter component in the input signal is attenuated. When $\alpha$ is $-1$ in particular, the jitter component in the input signal is canceled and the variable delay circuit 12 can generate a jitter-free output signal. That is, it is possible to amplify or attenuate the jitter component with desirable amplification factor or attenuation factor by adjusting at least one of the gains of the jitter amplifier 22 and the variable delay circuit 12.

It is preferable for the value of delay in the variable delay circuit 12 to vary linearly corresponding to the level of the given control signal. That is, it is preferable for the value of delay τ in the variable delay circuit 12 to be expressed by Equation 4 as follows:

$$\tau = \tau_0 + K_{VD} \cdot V_{CTRL} \quad \text{Eq. 4}$$

Where, $\tau_0$ denotes the initial value of delay described above, $K_{VD}$ denotes the gain in the variable delay circuit 12 and $V_{CTRL}$ denotes the level of the control signal.

Still more, the timing jitter of the k-th data transition (TJ1, TJ2, ... TJk, ... ) in the input signal is denoted as $\Delta\phi_{IN,k}$, level of the signal in which the timing jitter $\Delta\phi_{IN,k}$ is demodulated by the jitter amplifier 22 is denoted as $V_{CTRL,K}$ and the timing jitter of the k-th data transition in the output signal outputted out of the variable delay circuit 12 is denoted as $\Delta\phi_{OUT,K}$. When the k-th data transition of the input signal occurs, the jitter amplifier 22 detects the timing jitter $\Delta\phi_{IN,K}$ in the k-th data transition and outputs the control signal $V_{CTRL,K}$. At this time, the control signal $V_{CTRL,K}$ may be expressed by Equation 5 as follows:

$$V_{CTRL,k} = K_{JD} \cdot \Delta\phi_{IN,k} \quad \text{Eq. 5}$$

Where, $K_{JD}$ denotes the gain in the jitter amplifier 22.

From Equations 4 and 5, the delay time $\tau_k$ of the variable delay circuit 12 from the beginning of the k-th data transition of the input signal to the beginning of the k-th data transition of the output signal may be expressed by Equation 6 as follows:

$$\tau_k = \tau_0 + K_{VD} \cdot K_{JD} \cdot \Delta\phi_{IN,k} \quad \text{Eq. 6}$$

Still more, the time $\tau_k$ when the k-th data transition occurs in the input signal may be expressed by Equation 7 as follows:

$$\tau_k = kT + \Delta\phi_{IN,k} \quad \text{Eq. 7}$$

From Equations 6 and 7, the time $t'_k$ when the k-th data transition occurs in the output signal may be expressed by Equation 8 as follows:

$$t'_k = t_k + \tau_k = [kT + \tau_0] + [1 + K_{VD} \cdot K_{JD}] \cdot \Delta\phi_{IN,k} \quad \text{Eq. 8}$$

The second term of the right side of Equation 8 is the timing jitter $\Delta\phi_{OUT,K}$ of the output signal and the timing jitter of the input signal is $1+\alpha=1+K_{VD}\times K_{JD}$ as described above.

While the timing jitter has been exemplified in the above description, the same applies also to the period jitter.

The jitter amplifier 100 detects the timing jitter of the k-th data transition of the input signal for example and controls the timing of the k-th data transition of the input signal based on the jitter component. Due to that the jitter amplifier 22 must detect the jitter component in the k-th data transition and control the value of delay in the variable delay circuit 12 before the variable delay circuit 12 outputs the k-th data transition.

Then, the jitter amplifier 100 may further include means for delaying the timing for inputting the input signal to the variable delay circuit 12 corresponding to a period of time necessary for the jitter amplifier 22 to detect the jitter component. For example, the variable delay circuit 12 may have a delay circuit of a predetermined value of delay at the pre-stage of the variable delay circuit 12.

When the variable delay circuit 12 has a configuration in which a plurality of delay elements is connected in series, the variable delay circuit 12 may vary a value of delay for the input signal by varying a value of delay of the post-delay elements, not varying the value of delay of the predetermined number of pre-delay elements. A fixed value of delay of the predetermined number of pre-delay elements is preferable to be greater than the time necessary for the jitter amplifier 22 to demodulate the jitter component.

These arrangements allow the phase of the k-th data transition of the input signal to be controlled corresponding to the jitter component in the k-th data transition of the input signal.

Figure 3:
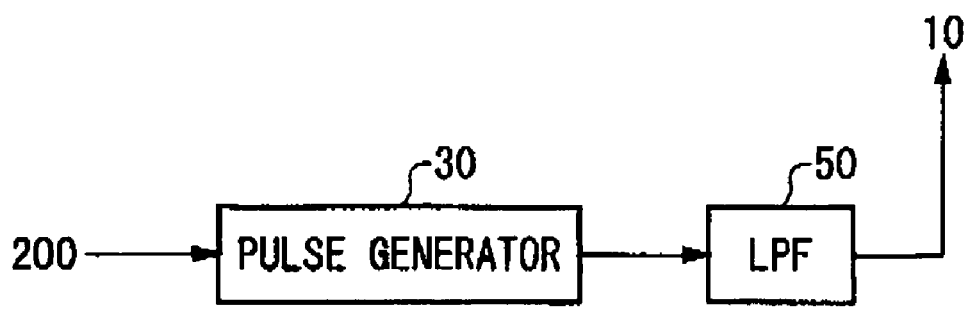
FIG. 3 is a diagram showing one exemplary configuration of a jitter amplifier 22.

FIG. 3 is a diagram showing one exemplary configuration of the jitter amplifier 22. The jitter amplifier 22 of this example is a circuit for demodulating the period jitter of the input signal and has a pulse generator 30 and a low-pass filter 50.

The pulse generator 30 outputs a pulse signal having a pulse width set in advance corresponding to edges of the input signal. The low-pass filter 50 demodulates the period jitter of the input signal by removing a carrier frequency component of the input signal.

Figure 4:
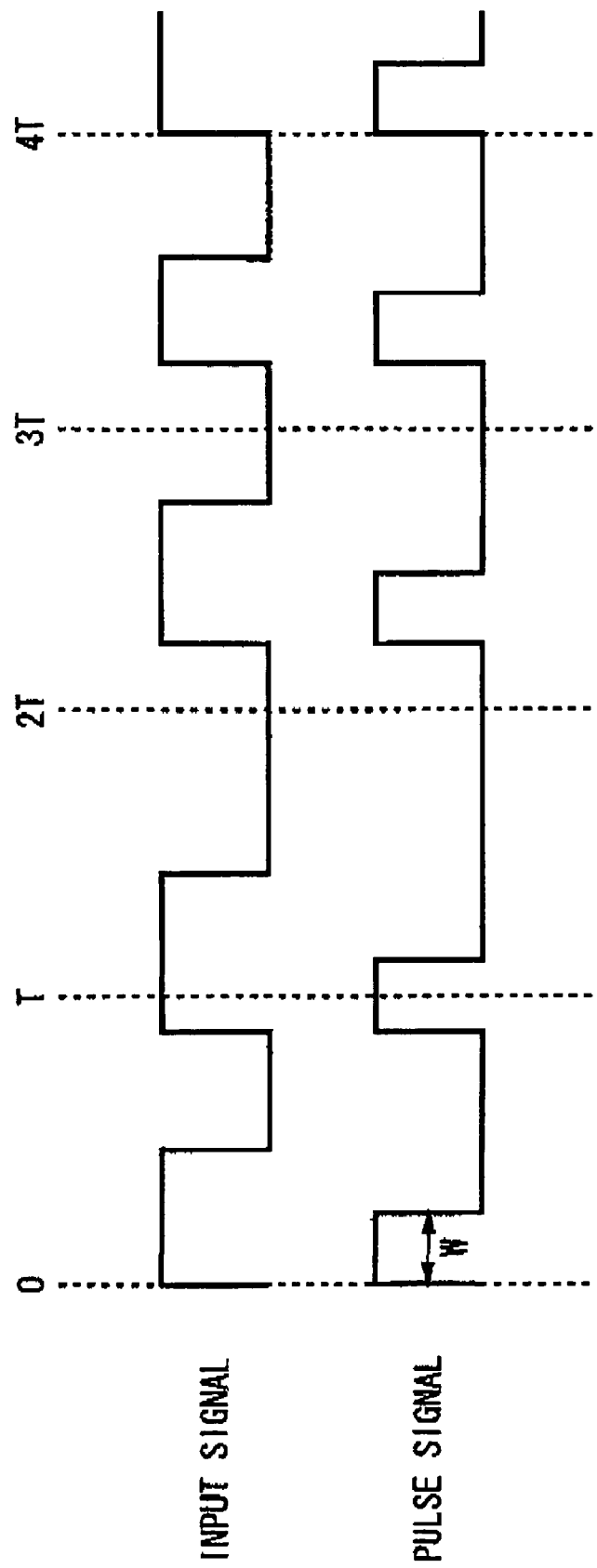
FIG. 4 is a chart showing one exemplary operation of a pulse generator 30 explained in FIG. 3.

FIG. 4 is a chart showing one exemplary operation of the pulse generator 30 explained in FIG. 3. In this example, the pulse generator 30 outputs the pulse signal having the pulse width W set in advance corresponding to rising edges of the input signal.

It is then possible to generate a control signal corresponding to the period jitter of the input signal by removing the carrier frequency component of the input signal from such pulse signal. The jitter amplifier 22 may further include a sample and hold circuit for sampling and holding the level of the control signal outputted out of the low-pass filter 50 with period corresponding to the ideal period of the input signal and for feeding it to the variable delay circuit 12. It allows the period jitter to be amplified or attenuated more accurately.

Figure 5:
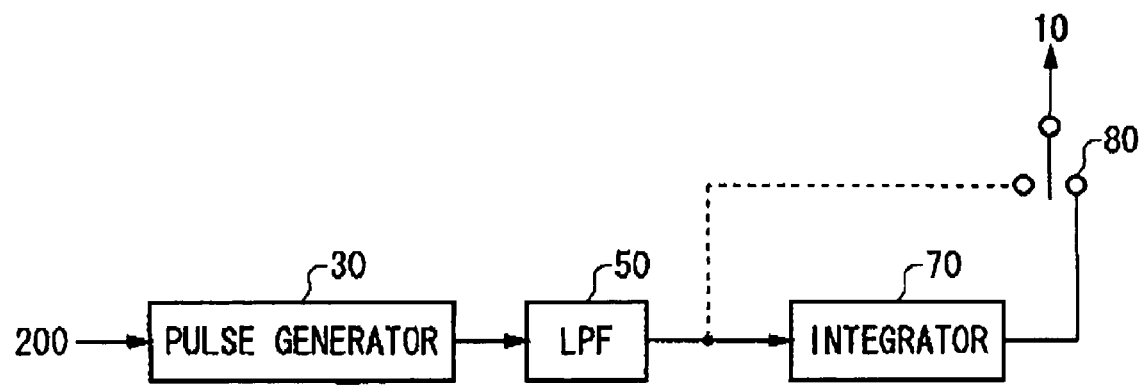
FIG. 5 is a diagram showing another exemplary configuration of the jitter amplifier 22.

FIG. 5 is a diagram showing another exemplary configuration of the jitter amplifier 22. The jitter amplifier 22 of this example is a circuit for demodulating the timing jitter of the input signal and further includes an integrator 70 in addition to the configuration of the jitter amplifier 22 explained in connection with FIG. 3. The pulse generator 30 and the low-pass filter 50 are the same with the pulse generator 30 and the low-pass filter 50 shown in FIG. 3.

The integrator 70 demodulates the timing jitter of the input signal by integrating the period jitter outputted out of the low-pass filter 50. For example, the integrator 70 outputs a control signal whose signal level increases with a predetermined rate of increment during when the pulse signal shown in FIG. 4 presents a logic H and whose signal level decreases with a predetermined rate of decrement during when the pulse signal presents a logic L. The integrator 70 can demodulate the timing jitter of the input signal through such operation. It is noted that the operation of the integrator 70 is not limited such exemplary operation. The integrator 70 may operate in any manner as far as it allows the timing jitter of the input signal to be demodulated.

The jitter amplifier 22 may further include a switch 80 for switching one, i.e., whether the period jitter or the timing jitter of the input signal, to be outputted. The switch 80 selects either the period jitter outputted out of the low-pass filter 50 or the timing jitter outputted out of the integrator 70 and supplies it to the variable delay circuit 12.

Figure 6:
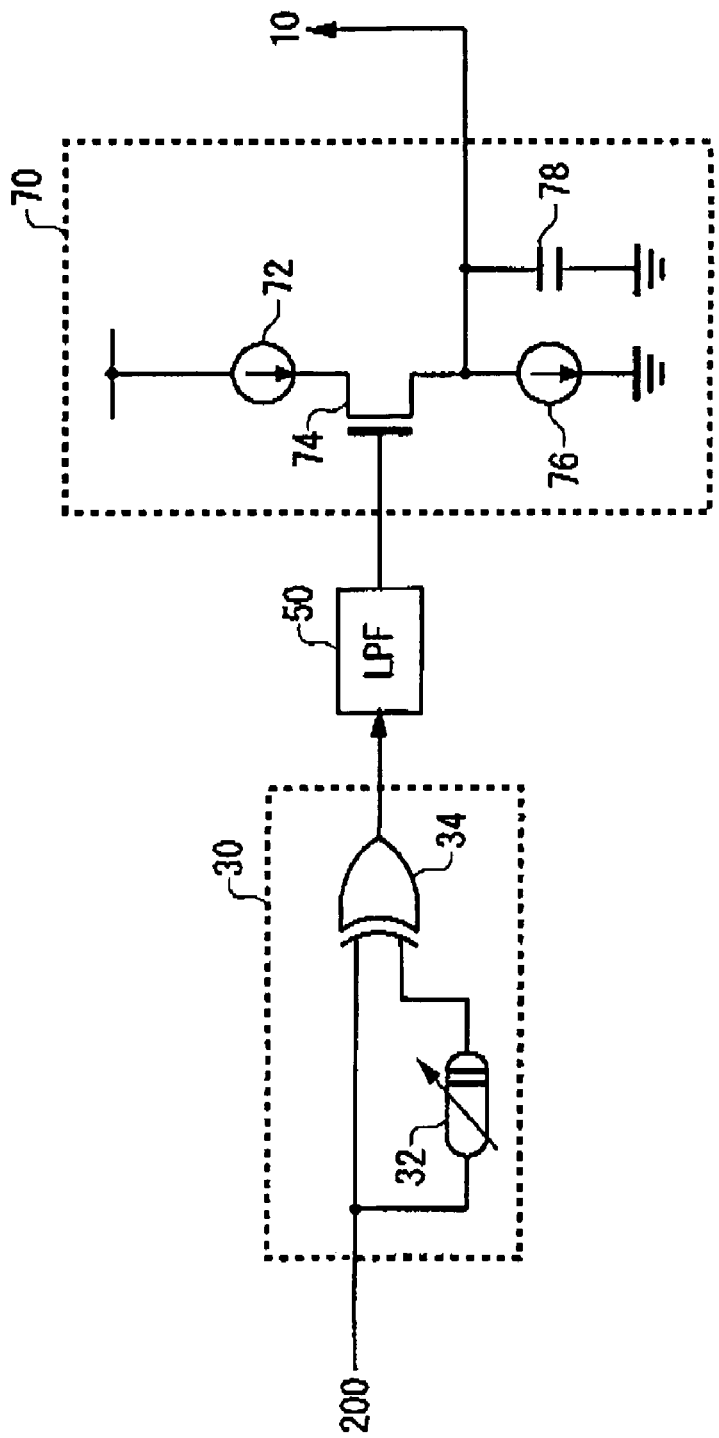
FIG. 6 is a diagram showing one exemplary detailed configuration of the jitter amplifier 22.

FIG. 6 is a diagram showing one exemplary detailed configuration of the jitter amplifier 22. The pulse generator 30 of this example has a variable delay circuit 32 and an exclusive OR circuit 34. The variable delay circuit 32 delays an input signal with a value of delay corresponding to a pulse width W that is what a pulse signal outputted out of the pulse generator 30 should have. The exclusive OR circuit 34 outputs an exclusive OR of the input signal and the signal outputted out of the variable delay circuit 32. Such arrangement allows the pulse signal as shown in FIG. 4 to be generated. However, the arrangement of the pulse generator 30 is not limited to such arrangement For example, the pulse generator 30 may adopt an arrangement using an AND circuit and the like.

The integrator 70 of this example has a source current source 72, a sink current source 76, a capacitor 78 and a charge/discharge control section 74. The source current source 72 generates source current that specifies the rate of increment of the control signal described above and the sink current source 76 generates sink current that specifies the rate of decrement of the control signal described above.

Charging/discharging the capacitor 78 by the source current source 72 and the sink current source 76 causes voltage level of the control signal to be generated. During when the pulse signal presents the logic H, the charge/discharge control section 74 charges the capacitor based on the source current and during when the pulse signal presents the logic L, discharges the capacitor based on current obtained by subtracting the sink current from the source current.

Such arrangement allows the control signal demodulating the timing jitter of the input signal to be generated.

Figure 7:
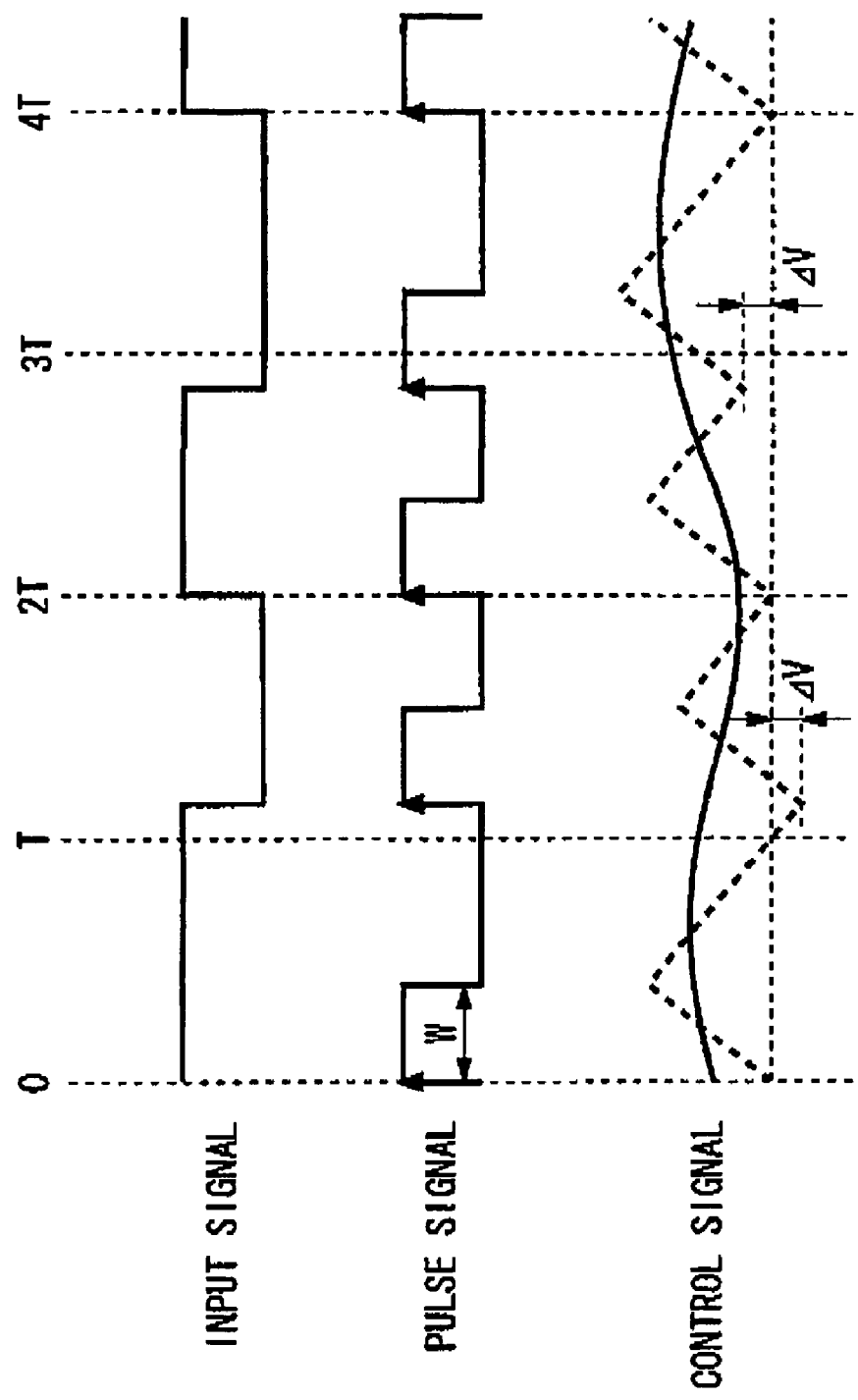
FIG. 7 is a chart showing one exemplary waveform of a control signal outputted out of an integrator 70 explained in FIG. 6.

FIG. 7 is a chart showing one exemplary waveform of the control signal outputted out of the integrator 70 explained in FIG. 6. The pulse generator 30 of this example also outputs the pulse signal corresponding to the rising and falling edges of the input signal.

The integrator 70 outputs the control signal whose signal level increases with the predetermined rate of increment during when the pulse signal present the logic H and whose signal level decreases with the predetermined rate of decrement during when the pulse signal presents the logic L as described above. FIG. 7 shows the control signal by a dotted line. When the input signal is jitter-free, extremal values of the control signal presented by the dotted line are on predetermined levels. For example, the minimum value is on a level of almost zero and the maximum value is on a certain level. When the input signal has timing jitter however, the extremal values have a difference ΔV, respectively, corresponding to a degree of jitter in relation to the predetermined levels as shown in FIG. 7.

It is then possible to amplify or attenuate the timing jitter component by controlling the value of delay in the variable delay circuit 12 based on such control signal. The integrator 70 may also include a sample and hold circuit for sampling and holding the control signal in response to the edges of the input signal and for feeding it to the variable delay circuit 12. The sample and hold circuit may pass and input the control signal to the variable delay circuit 12 during when the signal outputted out of the pulse generator 30 presents the logic U and may hold and input the signal level of the control signal to the variable delay circuit 12 during when the signal outputted out of the pulse generator 30 presents the logic L.

The integrator 70 may Other include an averaging circuit for averaging the control signal and feeding it to the variable delay circuit 12. FIG. 7 shows a waveform of the control signal outputted out of the averaging circuit by a solid line, The averaging circuit may remove a preset high-band component of the control signal. For example, the averaging circuit may output a running average value of the timing jitter of the input signal by time-averaging the control signal. The averaging circuit may also output the running average value of the timing jitter by removing a component of a signal outputted out of the integrator 70 when the input signal is timing jitter-free from the control signal outputted out of the integrator 70. The averaging circuit may realize the functions described above by using a low-pass filter for example.

Figure 8:
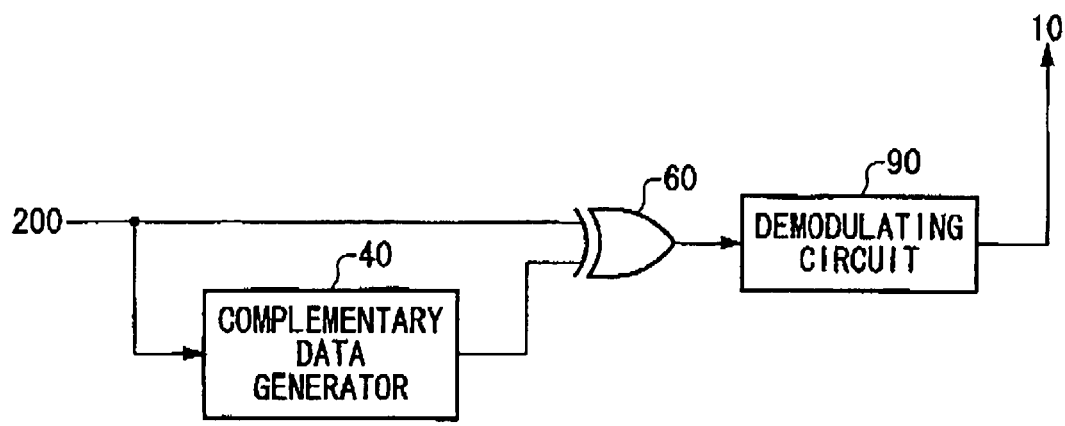
FIG. 8 is a diagram showing a still other exemplary configuration of the jitter amplifier 22.

FIG. 8 is a diagram showing a still other exemplary configuration of the jitter amplifier 22. In this example, an input signal is a data signal and the jitter amplifier 22 demodulates jitter of the data signal. The jitter amplifier 22 of this example has a complementary data generator 40, an exclusive OR circuit 60 and a demodulating circuit 90.

The complementary data generator 40 generates a complementary data signal whose data value transits at bit boundaries where data values of the data signal do not transit.

The exclusive OR circuit 60 outputs an exclusive OR of the data signal and the complementary data signal.

The demodulating circuit 90 demodulates jitter of a signal outputted out of the exclusive OR circuit 60. The demodulating circuit 90 may have the same configuration with the jitter amplifier 22 explained in connection with FIG. 3 or with the jitter amplifier 22 explained in connection with FIG. 5.

Figure 9:
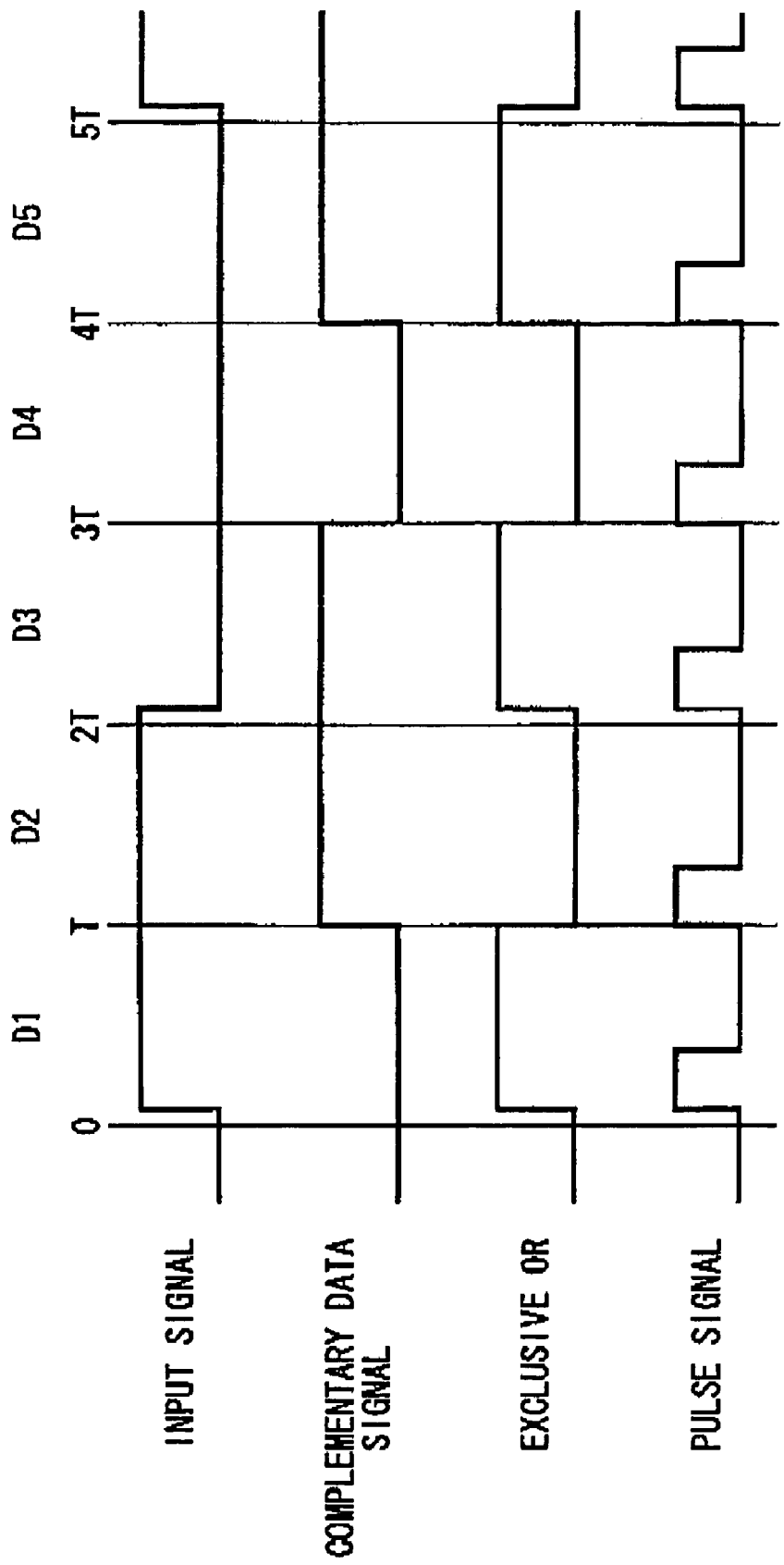
FIG. 9 is a timing chart showing one exemplary operation of a complementary data generator 40.

FIG. 9 is a timing chart showing one exemplary operation of the complementary data generator 40, The complementary data generator 40 receives the input data signal and generates a complementary data signal of the input data signal. The complementary data signal is a signal whose edge is provided per each boundary of data sections of the input data signal under a condition that the data value of the input data signal does not transit at the boundary of the data section. If edges of the input data signal and edges of the complementary data signal are to be arrayed on one and same time axis for example, the complementary data signal may be a signal whose edges and the edges of the input data signal are arrayed almost at same time intervals. The data section of the input data signal refers to a period of time during which one non-continuous data is held in the input data signal serially transmitted for example. It may also refer to a period of time during which symbolic data is held in an input data signal transmitted in multi-value. That is, the data section may be a bit interval or a symbol interval of the input data signal. For example, the data section of the input data signal in FIG. 9 is T and a data pattern during a period of time (0 through 6T) is 110001.

In the example shown in FIG. 9, the section (0-T, T-2T, 3T4T, . . . ) corresponds to the data sections (D1, D2, D3, . . . ). The boundaries of the respective data sections are (0, T, 2T, 3T, . . . ). In this example, the data values of the input data signal transit at the boundaries (0, T, 5T) of the data sections and the data values of the input data signal do not transit at the boundaries (T, 3T, 4T) of the data sections. Therefore, the complementary data generator 40 generates the complementary data signal having edges at the boundaries (T, 3T, 4T) of the data sections where the edges of the input data signal do not exist.

Because the input data signal has almost constant data sections, timing of the edge of the input data signal almost coincides with either one of timings (0, T, 2T, . . . ). In such a case, it is preferable for the complementary data generator 40 to generate the complementary data signal having edges at the boundaries of the data sections where the edges of the input data signal do not exist. Thereby, in terms of the edges of the both input data signal and the complementary data signal, the edges are arrayed almost at constant intervals. Such operation allows the jitter amplifier 22 to operate almost at constant intervals, dispersion of outputs that is otherwise caused by difference of operating intervals to be reduced and jitter to be accurately demodulated.

The exclusive OR circuit 60 outputs the exclusive-OR of the input data signal and the complementary data signal. It allows a signal in which edges are arrayed almost at constant intervals to be generated. Then, the jitter component of the input data signal is kept in that signal.

The demodulating circuit 90 outputs a pulse signal corresponding to the edges of that signal and demodulates the jitter component based on the pulse signal. When a control signal dependent on the jitter of the complementary data signal is outputted to the variable delay circuit 12, data of a data signal inputted to the variable delay circuit 12 does not transit. Therefore, even when a delay time of the variable delay circuit 12 varies in response to the jitter of the complementary data signal, the waveform of the output signal of the variable delay circuit 12 is not influenced. That is, even if the complementary data signal contains jitter, the variable delay circuit 12 can generate the output signal in which only jitter contained in the input data signal is amplified or attenuated by eliminating the influence of the jitter.

Figure 10:
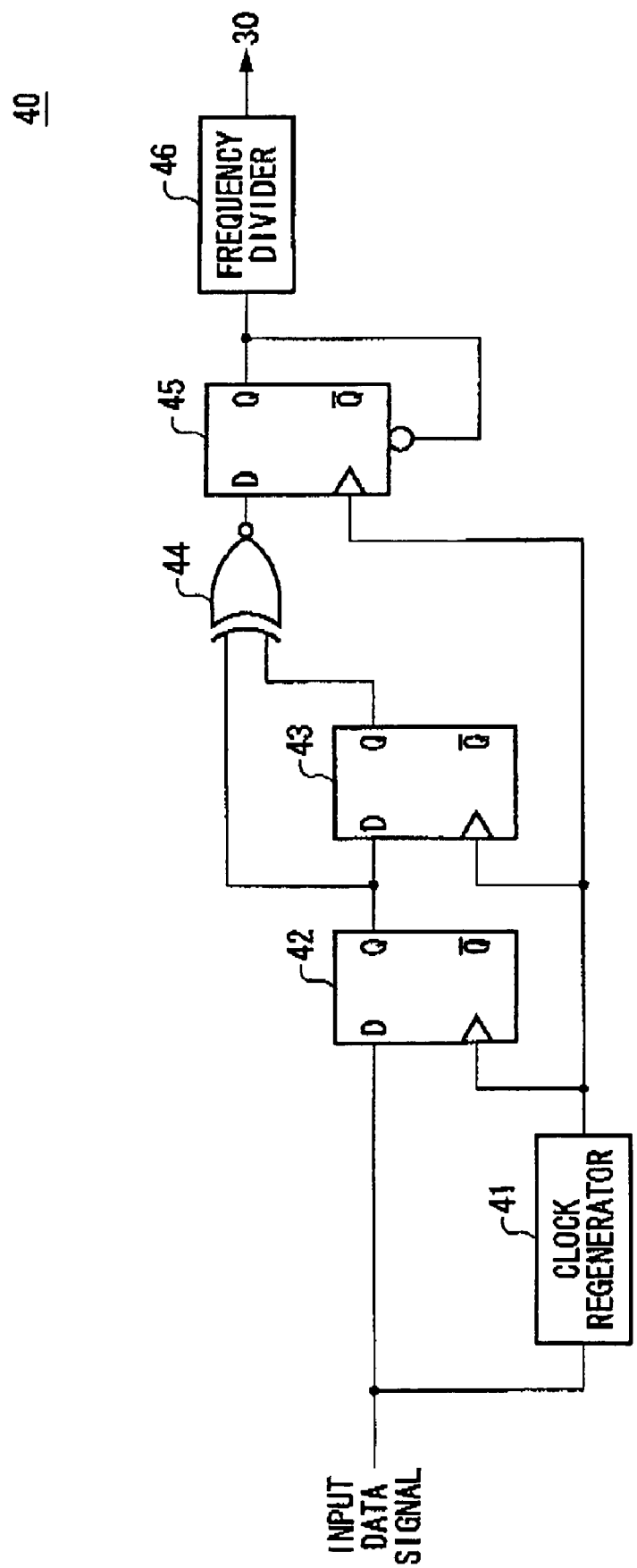
FIG. 10 is a diagram showing one exemplary configuration of the complementary data generator 40.

FIG. 10 is a diagram showing one exemplary configuration of the complementary data generator 40. The complementary data generator 40 of this example has a clock regenerator 41, a first D flip-flop 42, a second D flip-flop 43, a coincidence detector 44, a third D flip-flop 45 and a frequency divider 46.

Based on the input data signal, the clock regenerator 41 generates a clock signal having the almost same period with the data section of the input data signal. The first D flip-flop 42 takes in and outputs the input data signal corresponding to the clock signal.

The second D flip-flop 43 takes in and outputs a signal outputted out of the first D flip-flop 42 corresponding to the clock signal. That is, the second D flip-flop 43 outputs the signal outputted out of the first D) flip-flop 42 by delaying it by one period of the data section of the input data signal.

The coincidence detector 44 outputs the logic H when a value of the signal outputted out of the first D flip-flop 16 coincides with a value of the signal outputted out of the second D flip-flop 18.

The third D flip-flop 45 takes in and output the signal outputted out of the coincidence detector 44 corresponding to the clock signal. Its output signal resets internal data. That is, the third D flip-flop 45 outputs a pulse having a micro-pulse width shorter an the data section of the input data signal when the signal received from the coincidence detector 44 presents the logical value H when the third D flip-flop 45 receives a rising edge of the clock signal.

The frequency divider 46 divides the signal outputted out of the third D flip-flop 45 into halves to generate the complementary data signal. Here, 'dividing into halves' means to generate a signal whose logical value transits corresponding to either rising edge or falling edge of the signal outputted out of the third D flip-flop 45.

Such arrangement allows the complementary data signal of the input data signal to be readily generated. The configuration of the complementary data generator 40 is not also limited to the exemplary configuration described above. The complementary data generator 40 may be configured variously.

Figure 11:
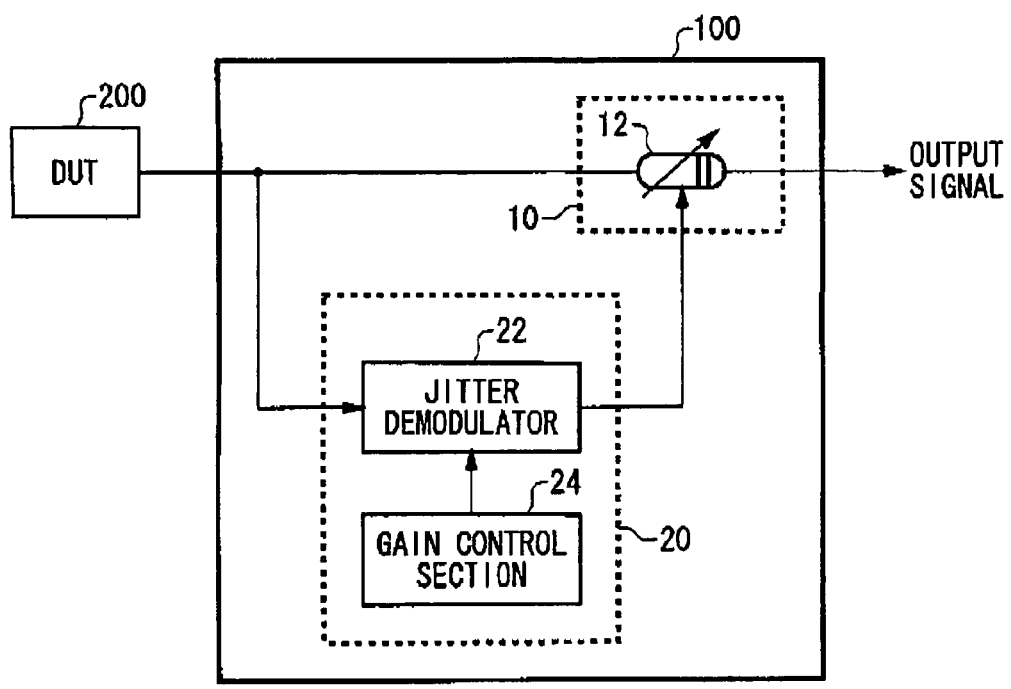
FIG. 11 is a diagram showing another exemplary configuration of a jitter amplifier 100.

FIG. 11 is a diagram showing another exemplary configuration of the jitter amplifier 100. The jitter amplifier 100 of the present embodiment is different from the jitter amplifier 100 explained in connection with FIG. 1 in the configuration of the sampling section 20. The amplifying circuit 10 is the same with the amplifying circuit 10 explained in connection with FIG. 1.

The sampling section 20 of the present embodiment further includes a gain control section 24 in addition to the components of the sampling section 20 explained in connection with FIG. 1. The jitter amplifier 22 is the same with the jitter amplifier 22 explained in connection with FIG. 1.

The gain control section 24 controls the gain $K_{JD}$ of the jitter amplifier 22. The gain of the jitter amplifier 22 is the amplification factor of the jitter component outputted out of the jitter amplifier 22 to the jitter component contained in the input signal.

The gain control section 24 may set the gain $K_{JD}$ of the jitter amplifier 22 at a plus or minus arbitral value. Thereby, the jitter amplifier 100 may have two functions of amplifying and attenuating the jitter component contained in the input signal. The gain control section 24 may control the gain also by controlling circuit parameters of the jitter amplifier 22. In this case, the gain control section 24 may control the gain by controlling an amount of current in the source current source 72 and the sink current source 76 explained in connection with FIG. 3 for example.

The gain control section 24 may also have means for amplifying or attenuating the signal outputted out of the jitter amplifier 22 or may control the gain with respect to the jitter component by other means.

The gain control section 24 may also control the gain in the jitter amplifier 22 so that the jitter component of the input signal is canceled in the variable delay circuit 12. That is, the gain control section 24 may control the gain in the jitter amplifier 22 so that 1+α described above is almost zeroed. It enables the jitter amplifier 100 to remove the jitter component contained in the input signal.

Figure 12:
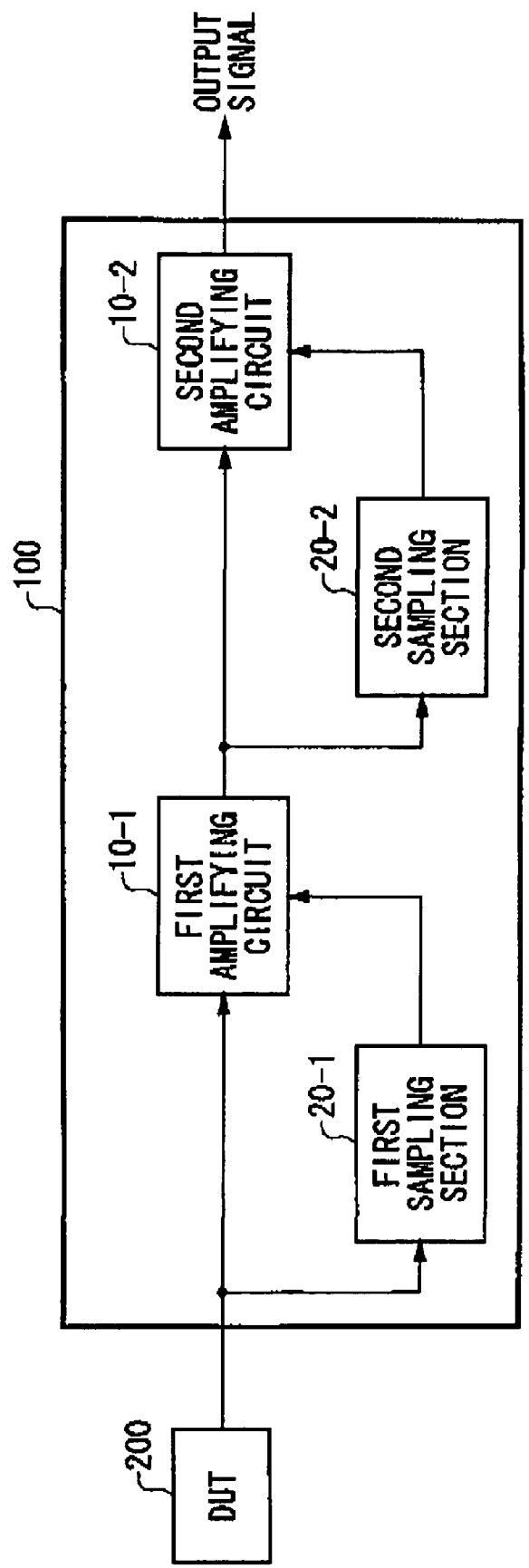
FIG. 12 is a diagram showing a still other exemplary configuration of the jitter amplifier 100.

FIG. 12 is a diagram showing a still other exemplary configuration of the jitter amplifier 100. The jitter amplifier 100 of the present embodiment has a first sampling section 20-1, a second sampling section 20-2, a first amplifying circuit 10-1 and a second amplifying circuit 10-2. The first and second sampling sections 20 have the same configuration with the sampling section 20 explained in connection with FIGS. 1 through 11. The first and second amplifying circuits 10 also have the same configuration with the amplifying circuit 10 explained in connection with FIGS. 1 through 11.

Receiving an input signal, the first sampling section 20-1 samples a jitter component from the input signal to control a value of delay in the first amplifying circuit 10-1. Also receiving the input signal, the first amplifying circuit 10-1 controls phase of the input signal based on the jitter component sampled by the first sampling section 20-1 to amplify or attenuate the jitter component in the input signal.

Receiving the signal outputted out of the first amplifying circuit 10-1, the second sampling section 20-2 samples the jitter component contained in the signal. Receiving the signal outputted out of the first amplifying circuit 10-1, the second amplifying circuit 10-1 controls phase of the signal based on the jitter component sampled by the second sampling section 20-2 to amplify or attenuate the jitter component contained in the signal.

Such arrangement allows the amplification factor or attenuation factor of the jitter component contained in the input signal to be synergistically increased. For example, even if the amplification factor per stage of the amplifying circuit 10 is limited, the jitter component may be amplified with a large amplification factor.

Although the jitter amplifier 100 of the present embodiment has the amplifying circuits 10 and sampling sections 20 by two stages each, it may have more stages of amplifying circuits 10 and sampling circuits 20.

Figure 13:
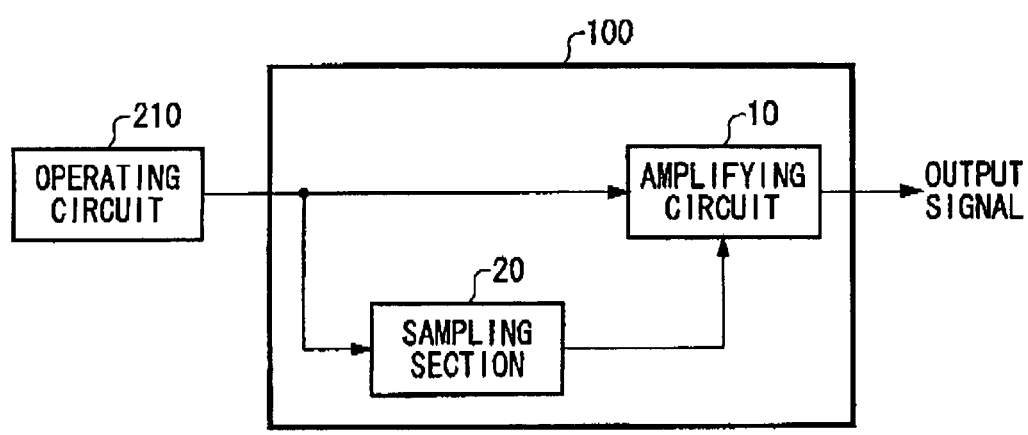
FIG. 13 is a diagram showing one exemplary configuration of an electronic device 200 according to the embodiment of the invention.

FIG. 13 is a diagram showing one exemplary configuration of an electronic device 200 according to the embodiment of the invention, The electronic device 200 has an operating circuit 210 and the jitter amplifier 100. The jitter amplifier 100 is the same with the jitter amplifier 100 explained in connection with FIGS. 1 through 12.

The operating circuit 210 generates an output signal to be outputted out of the electronic device 200. For example, the operating circuit 210 may be a circuit for generating the output signal corresponding to a signal given from the outside.

The jitter amplifier 100 amplifies or attenuates a jitter component of the output signal of the operating circuit 210.

Such arrangement allows the jitter component of the output signal of the electronic device 200 to be arbitrarily amplified or attenuated. For example, the electronic device 200 can output an almost jitter-free output signal by canceling the jitter component of the output signal by the jitter amplifier 100.

The jitter amplifier 100 may also operate so as to cancel the jitter component in actually using the electronic device 200 and so as to pass the output signal of the operating circuit 210 in testing the electronic device 200 (i.e., α=0). It allows the performance of the operating circuit 210 to be tested in testing the electronic device 200 and the output signal whose jitter has been reduced to be outputted in actually using the electronic device 200.

Figure 14:
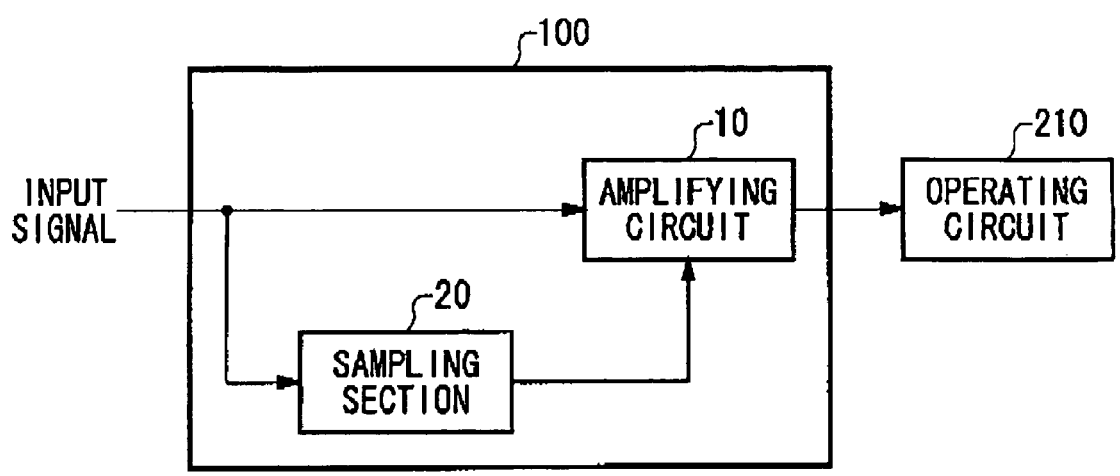
FIG. 14 is a diagram showing another exemplary configuration of the electronic device 200.

FIG. 14 is a diagram showing another exemplary configuration of the electronic device 200. The electronic device 200 of this example has the jitter amplifier 100 and the operating circuit 210. The jitter amplifier 100 outputs the jitter component contained in the input signal to be inputted to the electronic device 200 by amplifying or attenuating it.

The operating circuit 210 operates based on a signal outputted out of the jitter amplifier 100.

Such arrangement allows the jitter component of the signal to be inputted to the operating circuit 210 to be arbitrarily amplified or attenuated. For example, the jitter amplifier 100 may cancel the jitter component of the input signal in actually operating the electronic device 200. It enables the operating circuit 210 to operate based on the input signal whose jitter is almost zero. Therefore, errors in the operating circuit 210 may be reduced even if the input signal contains jitter.

Still more, the operating circuit 210 may pass the input signal or may control a degree of jitter of the jitter component contained in the input signal to a desirable degree in testing the electronic device 200. For example, even if a quantity of jitter that can be injected by an outside test apparatus is limited, it is possible to amplify the quantity of jitter within the electronic device 200 and to carry out a jitter breakdown test of the operating circuit 210.

Still more, the jitter amplifier 100 may pass the input signal in actually using or testing the electronic device 200.

Figure 15:
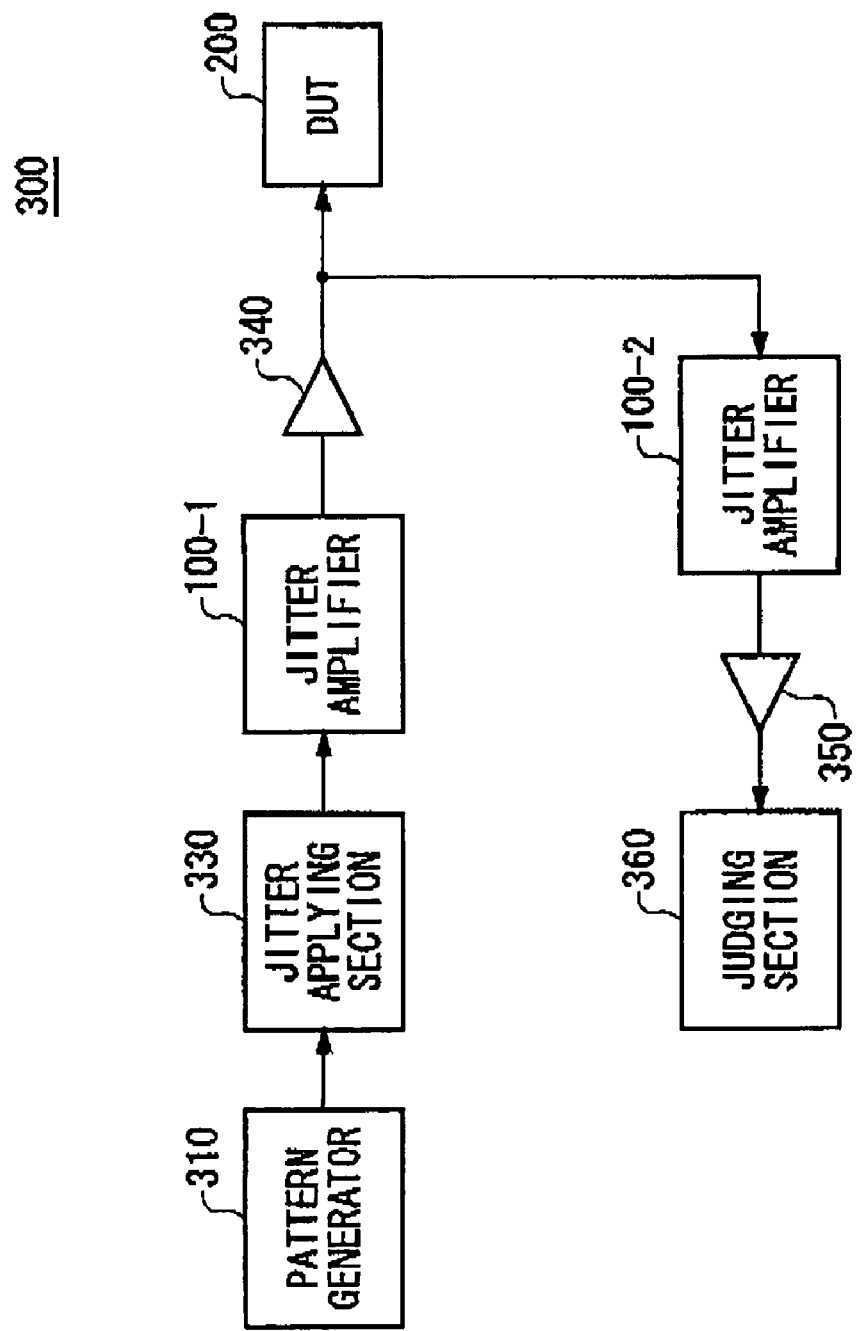
FIG. 15 is a diagram showing one exemplary configuration of a test apparatus 300 according to the embodiment of the invention.

FIG. 15 is a diagram showing one exemplary configuration of a test apparatus 300 according to the embodiment of the invention. The test apparatus 300 is a test apparatus for testing the electronic device 200 such as a semiconductor circuit and has a pattern generating section 310, a jitter injecting section 330, a plurality of jitter amplifiers 100, a driver 340, a comparator 350 and a judging section 360.

The pattern generating section 310 generates a test signal to be inputted to the electronic device 200. The jitter injecting section 330 generates a jitter component to be injected into the test signal and injects it into the test signal. For example, the jitter injecting section 330 injects period jitter or timing jitter into the test signal.

The first jitter amplifier 100-1 receives the test signal into which the jitter component has been injected and amplifies and outputs the jitter component. The driver 340 inputs the test signal outputted out of the first jitter amplifier 100-1 to the electronic device 200. Such arrangement allows a desirable quantity of jitter component to be injected into the electronic device 200. For example, it allows a large jitter component to be injected into the test signal even if the quantity of jitter that can be generated by the jitter injecting section 330 is limited. It then allows jitter yield strength of the electronic device 200 to be tested in a wider range.

The second jitter amplifier 100-2 receives the output signal outputted out of the electronic device 200 corresponding to the test signal and amplifies and outputs the jitter component contained in the output signal. For example, the comparator 350 detects the jitter component contained in the output signal outputted out of the second jitter amplifier 100-2. The judging section 360 judges whether or not the electronic device 200 is defect-free based on the jitter component detected by the comparator 350. For example, the judging section 360 may judge whether or not the electronic device 200 is defect-free based on the jitter component detected by the comparator 350 whether or not it falls within a predetermined range.

Such arrangement allows the jitter component contained in the output signal to be amplified and to be more accurately detected.

In testing the jitter yield strength of the electronic device 200 by using the first jitter amplifier 100-1, the first jitter amplifier 100-1 may amplify and output the signal and the second jitter amplifier 100-2 may pass the jitter component of the output signal of the electronic device 200, without amplifying it or may attenuate and input it to the comparator 350. In this case, the judging section 360 may judge whether or not the electronic device 200 is defect-free based on errors in the output signal.

Still more, the first jitter amplifier 100-1 may pass the jitter component in the test signal to be inputted, without amplifying it, when the jitter breakdown test of the electronic device 200 is not carried out.

Although the test apparatus 300 of the present embodiment has both of the first and second jitter amplifiers 100-1 and 100-2, the test apparatus 300 may not have either one of the jitter amplifiers 100 in another embodiment.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention allows the jitter component contained in the input signal to be amplified or attenuated.

What is claimed is:

1. A jitter amplifier for amplifying or attenuating a jitter component of an input signal, comprising:
    a jitter demodulator for demodulating said jitter component of said input signal and extracting an amount of the jitter component of the input signal; and
    an amplifying circuit configured to receive the input signal, amplify or attenuate said jitter component of the input signal by controlling a phase of an output signal thereof relative to a phase of the input signal based on said demodulated jitter component, and output the output signal containing the amplified or attenuated jitter component.

2. The jitter amplifier as set forth in claim 1, wherein said amplifying circuit has a variable delay circuit constructed and arranged to delay said input signal by an amount based on said jitter component.

3. The jitter amplifier as set forth in claim 2, wherein said jitter demodulator outputs a voltage corresponding to said jitter component; and said variable delay circuit delays said input signal by an amount corresponding to a value of voltage output from of said jitter demodulator.

4. The jitter amplifier as set forth in claim 2, wherein said jitter demodulator outputs a current corresponding to said jitter component; and said variable delay circuit delays said input signal by an amount corresponding to a value of current output from of said jitter demodulator.

5. The jitter amplifier as set forth in claim 2, wherein said jitter demodulator demodulates period jitter of said input signal.

6. The jitter amplifier as set forth in claim 5, wherein said jitter demodulator comprises:
   a pulse generator for outputting a pulse signal having a preset pulse width corresponding to edges of said input signal; and
   a low-pass filter for demodulating said period jitter by removing a carrier frequency component of said input signal from said pulse signal.

7. The jitter amplifier as set forth in claim 2, wherein said jitter demodulator is constructed and arranged to demodulate timing jitter of said input signal.

8. The jitter amplifier as set forth in claim 7, wherein said jitter demodulator comprises:
   a pulse generator for outputting a pulse signal having a preset pulse width corresponding to edges of said input signal;
   a low-pass filter for demodulating said period jitter by removing a carrier frequency component of said input signal from said pulse signal; and
   an integrator for demodulating the timing jitter of said input signal by integrating said period jitter output from said low-pass filter.

9. The jitter amplifier as set forth in claim 2, wherein said input signal is a data signal; and said jitter demodulator demodulates jitter of said data signal.

10. The jitter amplifier as set forth in claim 9, wherein said jitter demodulator comprises:
    a complementary data generator for generating a complementary data signal whose data value transits at bit boundaries where a data value of said data signal does not transit;
    an exclusive OR circuit for outputting an exclusive OR of said data signal and said complementary data signal; and
    a demodulating circuit for demodulating jitter of a signal output from said exclusive OR circuit.

11. The jitter amplifier as set forth in claim 2, further comprising a gain control section for controlling an amplification factor of said jitter component from said jitter demodulator with respect to said jitter component contained in said input signal.

12. The jitter amplifier as set forth in claim 11, wherein said gain control section controls the amplification factor in said jitter demodulator so that said jitter component is canceled in said variable delay circuit.

13. The jitter amplifier as set forth in claim 3 or 4, wherein an amount of delay in said variable delay circuit varies substantially linearly with respect to the voltage value or current value output from said jitter demodulator.

14. The jitter amplifier as set forth in claim 1, wherein said jitter amplifier has first and second jitter demodulators and first and second amplifying circuits, wherein
   said first jitter demodulator demodulates said jitter component of said input signal;
   said first amplifying circuit amplifies or attenuates the jitter component of said input signal by controlling a phase of said input signal based on said jitter component demodulated by said first jitter demodulator;
   said second jitter demodulator demodulates the jitter component of a signal output from said first amplifying circuit; and
   said second amplifying circuit amplifies or attenuates the jitter component of said signal by controlling a phase of the signal output from said first amplifying circuit based said jitter component demodulated by said second jitter demodulator.

15. A method for amplifying a jitter component of an input signal, comprising:
   demodulating said jitter component from said input signal and extracting an amount of the jitter component of the input signal; and
   amplifying or attenuating said jitter component of the input signal by controlling phase of said input signal based on said demodulated jitter component, outputting an output signal containing the amplified or attenuated jitter component.

16. An electronic device, comprising:
   an operating circuit for generating an output signal of the electronic device; and
   a jitter amplifier for amplifying or attenuating, and then outputting a jitter component of said output signal;
   wherein said jitter amplifier has
      a jitter demodulating section for demodulating said jitter component and extracting an amount of the jitter component of the output signal; and
      an amplifying circuit configured to receive the output signal of the electronic device, amplify or attenuate said jitter component of the output signal of the electronic device by controlling phase of said output signal based on said demodulated jitter component.

17. An electronic device comprising:
   a jitter amplifier for amplifying or attenuating, and then outputting a jitter component of an input signal to the electronic device; and
   an operating circuit that operates based on a signal output from said jitter amplifier; and
   wherein said jitter amplifier comprises:
      a jitter demodulating section for demodulating said jitter component; and
      an amplifying circuit for amplifying or attenuating said jitter component by controlling phase of said input signal based on said demodulated jitter component and outputting the output signal containing the amplified or attenuated jitter component.

18. A test apparatus for testing an electronic device, comprising:
   a pattern generating section for generating a test signal to be input to said electronic device;
   a jitter injecting section for injecting a jitter component into said test signal;
   a jitter amplifier for amplifying or attenuating said jitter component injected into said test signal; and
   a driver for inputting an output signal of said jitter amplifier to said electronic device; wherein
   said jitter amplifier has
      a jitter demodulating section for demodulating said jitter component and extracting an amount of the jitter component of the test signal; and
      an amplifier circuit configured to receive the test signal, amplify or attenuate said jitter component of the test signal by controlling a phase of said test signal based on said jitter component and output the output signal containing the amplified or attenuated jitter component.

19. A test apparatus for testing an electronic device, comprising:
- a jitter amplifier for amplifying or attenuating a jitter component of an output signal of said electronic device;
- a comparator for measuring an output signal of said jitter amplifier; and
- a judging section for judging whether or not said electronic device is defect-free based on a result measured by said comparator; wherein
- said jitter amplifier comprises:
  - a jitter demodulating section for demodulating said jitter component from said test signal and extracting an amount of the jitter component of the test signal; and
  - an amplifier configured to receive the test signal, amplify or attenuate said jitter component of the test signal by controlling a phase of an output signal corresponding to said test signal based on said jitter component, and output the output signal containing the amplified or attenuated jitter component.

20. A method for testing an electronic device, comprising:
- generating a test signal to be input to said electronic device;
- injecting a jitter component into said test signal to form a jitter injected test signal;
- amplifying or attenuating said jitter component injected into said test signal; and
- inputting the signal output during said amplifying step to said electronic device; wherein
- said amplifying or attenuating comprises:
  - demodulating said jitter component and extracting an amount of the jitter component of the test signal; and
  - amplifying or attenuating said jitter component of the test signal by controlling a phase of said signal based on said jitter component and outputting an output signal containing the amplified or attenuated jitter component.

21. A testing method for testing an electronic device, comprising:
- amplifying or attenuating a jitter component of an output signal of said electronic device and providing an amplified output signal indicative of the jitter component;
- measuring a value of said output signal; and
- judging whether or not said electronic device is defect-free based on the value measured in said measuring; wherein
- said amplifying or attenuating comprises:
  - demodulating said jitter component and extracting an amount of the jitter component of the output signal; and
  - amplifying or attenuating said jitter component of the output signal by controlling a phase of said amplified output signal based on said jitter component, and outputting the output signal containing the amplified or attenuated jitter component.

22. The jitter amplifier as set forth in claim 1, wherein said amplifying circuit controls the phase of the output signal in the corresponding period of the input signal in response to an amount of jitter component detected in each period of the input signal.

* * * * *